United States Patent [19]

Cioccio et al.

[11] 4,193,029
[45] Mar. 11, 1980

[54] PULSED HELIUM MAGNETOMETER

[75] Inventors: Armand Cioccio, Silver Spring; Walter C. Folz, Bethesda, both of Md.

[73] Assignee: The United States of America as represented by the Secretary of the Navy, Washington, D.C.

[21] Appl. No.: 262,810

[22] Filed: Mar. 4, 1963

[51] Int. Cl.$^2$ .............................................. H01S 1/06
[52] U.S. Cl. ........................................ 324/301; 331/3
[58] Field of Search ...................... 324/0.5, 43; 331/3, 331/94; 330/4

[56] References Cited

U.S. PATENT DOCUMENTS

| 3,103,621 | 9/1963 | Fraser | 324/0.5 |
| 3,129,389 | 4/1964 | Pochard et al. | 331/3 |

OTHER PUBLICATIONS

Rice, I. R. E. International Convention Record, vol. 9, PO 9, 3/23/61, pp. 244–248.

*Primary Examiner*—Nelson Moskowitz
*Attorney, Agent, or Firm*—R. S. Sciascia; A. L. Branning

EXEMPLARY CLAIM

1. A pulsed helium magnetometer comprising;
    a cell containing metastable helium adapted to be placed in a magnetic field to be measured,
    means including a helium lamp for optically pumping said metastable helium to produce atomic alignment of the helium atoms capable of undergoing magnetic resonance at a frequency dependent on said magnetic field,
    means for pulsing said lamp to transmit high intensity light pulses to said cell,
    detection means connected to receive light pulses radiated by said cell and to provide an output signal representative of variations in intensity of said radiated pulses,
    variable frequency oscillator means for receiving said output signal means responsive to said oscillator means for establishing a continuously applied non-interrupted RF field to said helium atoms substantially at said magnetic resonance frequency,
    phase detector means interconnecting said variable frequency oscillator means and said detection means for locking said variable frequency oscillator to said resonant frequency in response to said output signal,
    means for coupling said RF field to said helium atoms in said cell,
    and means for measuring the frequency of said variable frequency oscillator upon variation thereof in response to said output signal representative of variations in said radiated light pulses in accordance with changes in the background magnetic field incident upon said cell.

9 Claims, 3 Drawing Figures

PULSED HELIUM MAGNETOMETER

The invention described herein may be manufactured and used by or for the Government of the United States of America for governmental purposes without the payment of any royalties thereon or therefor.

The present invention relates to a low power helium magnetometer and more particularly to a pulsed helium magnetometer which will record a sample per second of diurnal and other variations of the earth's total magnetic field and will detect a change in the value of this field.

In the field of magnetometers, one method of measuring magnetic fields has been to continuously excite cells of rubidium vapor mercury, or helium, by a UHF oscillator and to continuously detect and record variations in the output signal of the cell representative of changes in the surrounding magnetic field. These continuously excited magnetometers required for their operation a considerable amount of power and human effort, and their dynamic range was controlled by a number of fixed crystals. Vapor magnetometers, when operated in the continuous mode, are limited to applications where a considerable amount of electric power is readily available, and since manual assistance is involved in their operation, this will automatically disqualify them for long-term unattended operation. In addition, the dynamic range of these magnetometers is limited to applications where background magnetic fields are known in advance.

The general purpose of this invention is to provide a new magnetometer having sensitivity and various other characteristics essentially the same as other continuously operated magnetometers, and the power requirement for its operation reduced by more than one order of magnitude over those of the prior art. In one application of the invention, by mixing the output signals of two similar magnetometers, the dynamic range of the magnetometer is made independent of the magnitude of the background field providing that the field difference between the two separately employed magnetometers is not greater than 10 milligauss. The terms magnetometer or magnetometer system are used synonymously herein in reference to the single or differential magnetometer arrangement. By employing a second magnetometer to make the dynamic range of the entire magnetometer system independent of the background field, and by using a rate meter rather than a narrow band frequency discriminator to receive the output signal from the F.M. oscillator, the dynamic range can be increased by one order of magnitude over the single magnetometer, and the selection of a crystal for the bias oscillator is no longer a critical factor.

A foremost object of the present invention is the provision of a new and improved sensitive magnetometer of considerable practical value where long term unattended operation is a critical factor.

Another object is to provide a pulsed helium magnetometer operable at low power levels for portable applications.

A further object of the invention is the provision of a magnetometer capable of measuring the total geomagnetic field and recording its variations once per second with a sensitivity of $2 \times 10^{-6}$ oersted.

A still further object of this invention is to provide an electronic method of converting a pulsed light signal into a usable magnetometer signal without an appreciable loss of sensitivity.

Yet another object of the present invention is to provide light feedback control to the pulsed magnetometer input to insure optimum performance of the system.

With these and other objects in view, as will hereinafter more fully appear, and which will be more particularly pointed out in the appended claims, reference is now made to the following description taken in connection with the accompanying drawings in which:

Figure 1:
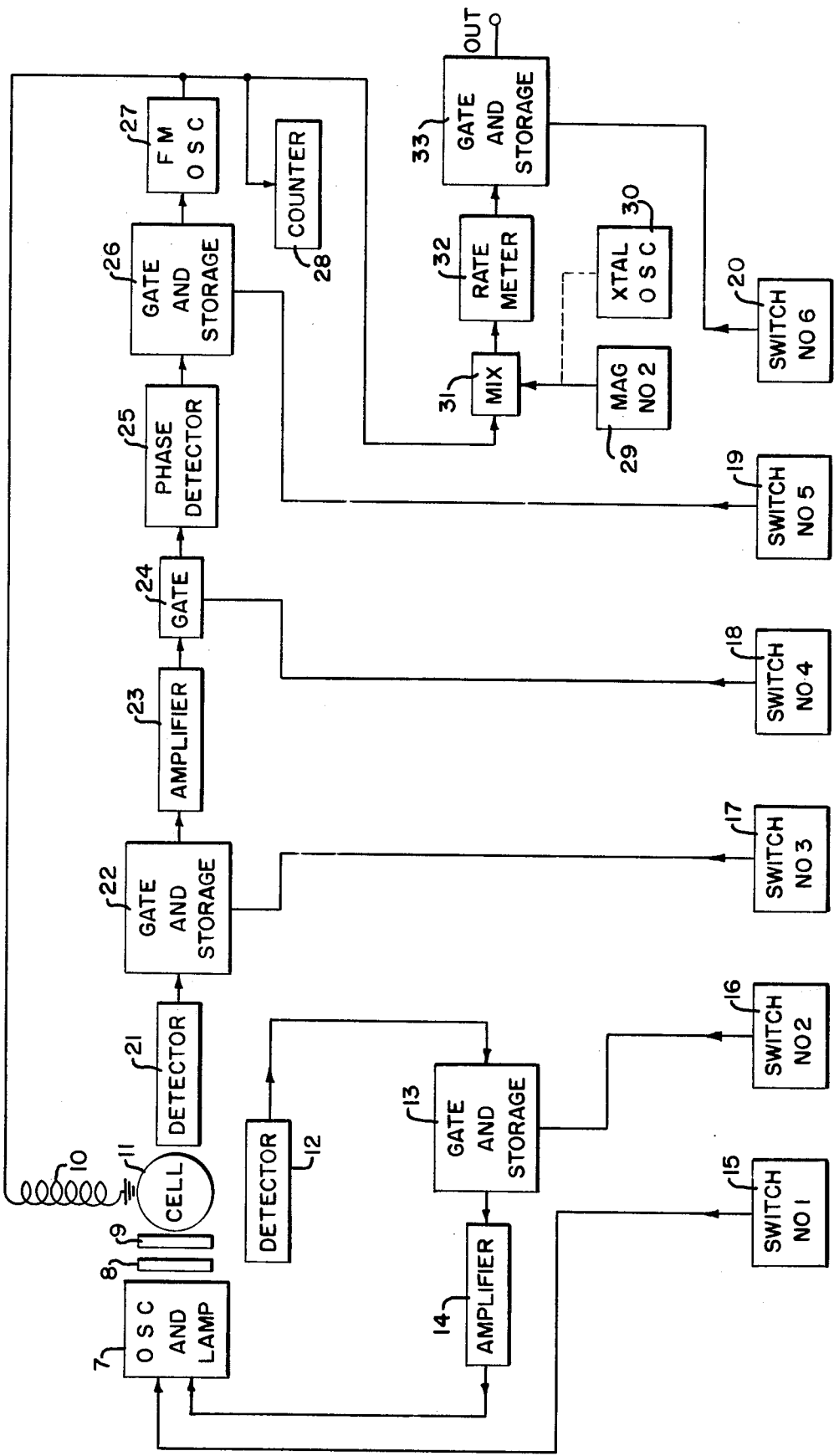
FIG. 1 is a block diagram of one form of the invention employing two similar magnetometers interconnected to form a differential magnetometer system.

In prior art magnetometer systems employing circuitry of the type shown in FIG. 1, the ultra-high frequency oscillator in lamp 7 was continuously operated for continuous excitation of cell 11, and a single detector, such as detector 21, was also in continuous operation to provide an output signal. These prior art magnetometers also employed an amplifier 23, a phase detector 25, a voltage controlled FM oscillator 27, and a mixer connected in a manner shown in FIG. 1 of the present invention, and, in addition, a crystal oscillator 30 not forming part of the present invention was mixed with the output of the FM oscillator 27. By feeding the output of the mixer to a narrow band discriminator, a signal of limited dynamic range representative of variations in the surrounding magnetic field could be obtained in the output of said narrow band discriminator (not shown). A considerable amount of human effort was required to select a proper crystal and to adjust the mixer 31 to obtain a desired signal from the discriminator.

In measuring background variations of the geomagnetic field within the frequency range of 0–0.1 cycle per second, and because of the low frequencies to be recorded, the pulsed magnetometer of FIG. 1 was designed to have an "ON" cycle of 100 milliseconds at a repetition rate of one cycle per second. The operation of the pulsed metastable helium magnetometer in FIG. 1 is based on the properties of the fundamental particles in a magnetic field and in which the atomic alignment of helium atoms in cell 11 is obtained by optical pumping. The pulsed mode of operation is made possible by the fact that the pumping time for atomic alignment of metastable helium atoms in cell 11 is about $1.6 \times 10^{-3}$ seconds, and the relaxation time of the oriented metastable helium atoms in the discharge is about $2.5 \times 10^{-4}$ seconds. The quantum transitions within the helium cell are relatively simple and they lack the peculiar plasma oscillations that plague other systems when pulsed. The helium system does not exhibit strong self-reversal as a function of the ambient temperature, and the helium lamp 7, when pulsed, does not exhibit large intensity fluctuation noise. Relatively longer life is expected from a helium lamp by comparison with other systems when pulsed mode of excitation is used.

The basic theory involved in the design of the helium cell and in the optical pumping thereof is disclosed in Vol. 119, No. 2 of PHYSICAL REVIEW, July 15, 1960, on pages 680–690. All instruments reported to date of the magnetometer variety share the following apparatus in common, as shown in FIG. 1: a light source 7 producing an intense beam of resonance radiation, a circular polarizer 8, an absorption cell 11 containing metastable helium to be optically pumped, a radio-frequency coil 10 to produce resonance in the pumped metastable helium, and the photo-cell detector 21 as described above to monitor the transmission of the light from cell 11. However, the use of a pulsed metastable helium lamp 7 distinguishes the magnetometer of the present invention over those of the prior art and requires a more complex technique to monitor the transmission of pulsed light from metastable helium cell 11. Since gaseous helium can be optically pumped at practically any temperature, and since the magnetic moment of the helium nucleus is zero and does not introduce hyperfine level splitting of the helium atom, helium provides a particularly good working substance for the magnetometer.

The helium atom normally exists in its lowest energy state with both electrons in the same shell and their spins anti-parallel to each other. The helium atom may be excited with an electric discharge, for example, so that one electron moves to the next shell and its spin is reversed, now the two electron spins are parallel. In spite of the relatively high energy involved, it is not possible for the atom to return to the lowest, or ground state, by emitting electro-magnetic radiation, but rather only by collisions with free electrons or atoms. On the atomic time scales, this state may be quite long lived and is termed the metastable state.

Figure 2:
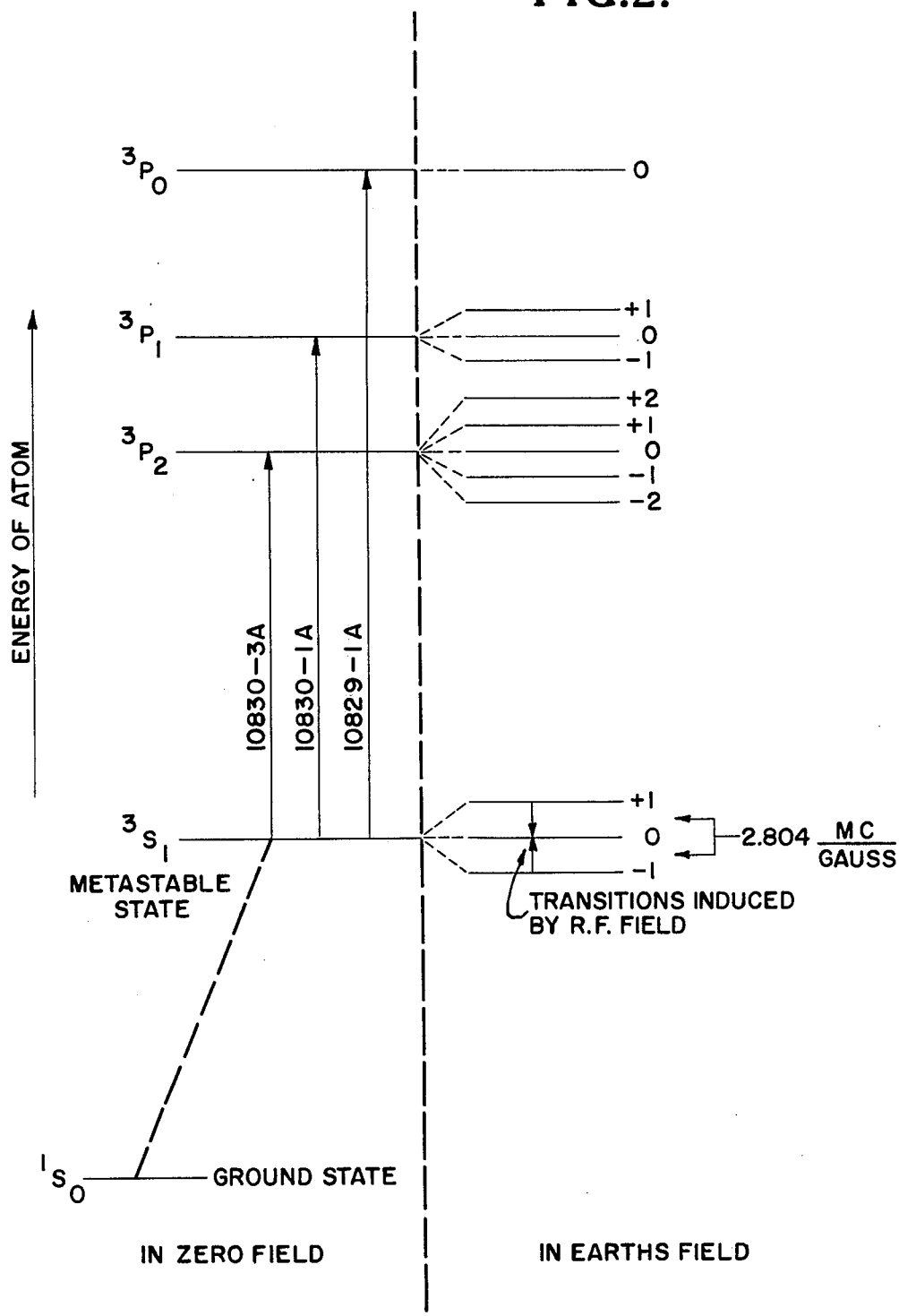
FIG. 2 shows the relevant energy levels of a helium atom in an external magnetic field.

The metstable helium atom has a magnetic moment such that there are three possible orientations in a magnetic field; hence there are three energy sublevels in this state forming a triplet. Referring to FIG. 2, these sublevels have been designated $M=+1$, $M=0$, and $M=-1$. The separation of these levels is proportional to the external magnetic field, and the energy difference between levels corresponds to a radiated frequency from cell 11 of approximately 2.8 megacycles per second per gauss. Thus a measurement of FM oscillator 27 output frequency is also a measurement of the spacing of these three magnetic sublevels.

As pulsed infrared radiation from helium lamp 7 passes through a circular polarizer consisting of a plane polarizer 8 and the quarter wave plate 9 and the left or right polarized radiation will enter the absorption cell 11 containing a mixture of metastable and normal helium. The metastable helium atoms absorb radiation from the beam and are excited to higher energy levels designated as $3P_0$, $3P_1$, and $3P_2$, as shown in FIG. 2. Eventually the helium atoms in these levels re-emit radiation and return to the metastable state $3S_1$. The $3P_1$ and $3P_2$ levels are normally not resolved and thus are assumed to have equal intensities, but the $3P_0$ level is resolved in its intensity and is usually considerably lower because of its smaller statistical weight. The lifetime of the excited state is long enough for collisions between helium atoms to equalize the populations of the sublevels of the excited state, and therefore the potential probabilities for transition to the three sublevels of the metastable state are equal. The populations of the metastable state $3S_1$ sublevels, as well as their relative absorption rates, depends upon the sense of polarization of the light from helium lamp 7 and the angle between the light axis and the external magnetic field at their point of intersection at cell 11. For the case of complete mixing of the $3P_0$, $3P_1$, $3P_2$ states and for the circular light, the resulting expressions for angular dependence is $S=S_0 \cos^4 \theta$ where $\theta$ is the angle between the magnetic axis and the light beam. When the angle $\theta$ equals 90°, the transition probabilities are equal, for example, when the magnetometer is mounted vertically at the earth's equator, the populations as well as their relative absorption rates remain constant thus producing no change in output signal from cell 11 when the resonance RF signal in coil 10 is present. However, at any other angle, and when the resonance RF signal in coil 10 is not present, the light absorbed by the cell 11 is proportional to the number of atoms in each energy level of FIG. 2 and the relative absorption probability for that level. Thus, the signal can be represented by the difference in the amount of light absorbed when the levels are equally populated, by forced equality due to the presence of a RF magnetic field in coil 10 at the Zeeman frequency, and when they are optically pumped by helium lamp 7. In other words, by employing optical pumping, the atom population of one state or energy level can be increased while decreasing the atom population of others, and by application of a radio frequency field in coil 10 in resonance with the magnetic field in cell 11, the atom population of each state of the triplet is again altered. When the population in each state is altered, the intensity of the radiation coming from the cell 11 is likewise altered, and magnetometer action is realizable by detecting the change of radiation from cell 11 and by measuring the frequency at resonance with the impinging magnetic field which produces the change of radiation.

The detector 21 which may be of the lead sulphide photocell variety detects the variation in light intensity applied thereto and such variation 41 will be transferred to the voltage controlled FM oscillator 27 to provide a feedback resonance signal 42 in coil 10. The circuitry of FIG. 1 including gates 22, 24, and 26, along with amplifier 23 and phase detector 25 are connected to form a feedback control loop, the purpose of which is to lock the frequency of the voltage controlled oscillator 27 to the resonance line of the absorption cell 11. By using frequency, or phase sensitive detection, at 25, this lock-in voltage may be developed to lock the FM oscillator 27 to the center of the resonance line of the cell 11, and the FM oscillator 27 frequency is then directly proportional to the varying magnetic field impinging on cell 11. Therefore, the voltage controlled oscillator 27 will track the resonance line of the absorption cell 11 over a wide range of magnetic background field, and the FM oscillator 27 may be regulated to an accuracy determined by the sensitivity of the resonance line of cell 11, the loop gain of the system, and the basic instability of the oscillator.

Figure 3:
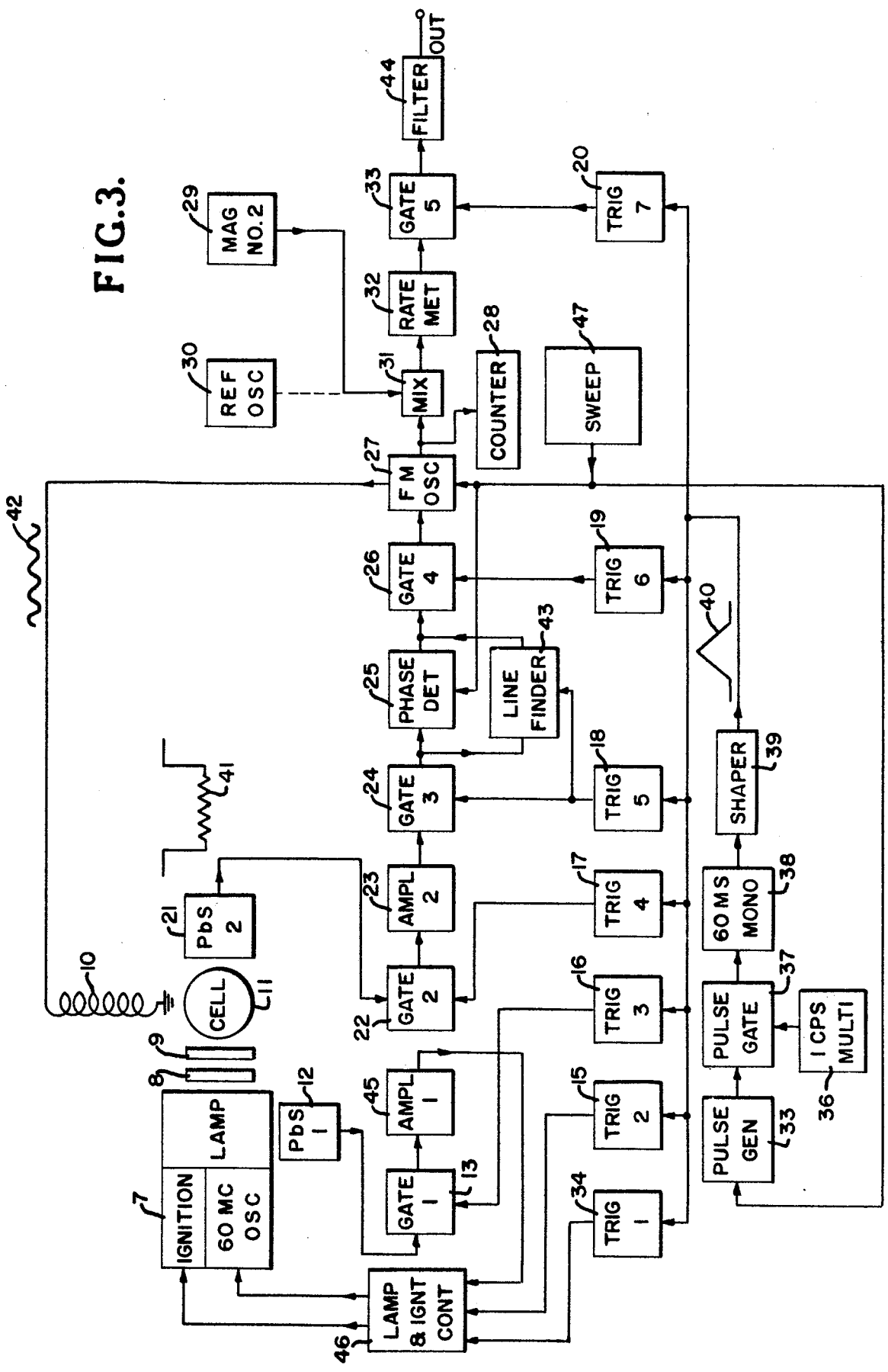
FIG. 3 is a modified form of FIG. 1 including trigger circuits which may comprise the various switching blocks of FIG. 1.

A line finder circuit 43 as shown in FIG. 3 is also useful in the magnetometer system, and the FM oscillator 27 begins a slow sweep that can cover the whole operating range of frequency when the system is first turned on. This sweep takes place only during the 100 millisecond pulse to avoid missing the resonance line between pulses, and the sweep cuts off and the system locks in on the resonance line when said line is found by 43.

OPERATION

By application of the invention as shown in FIG. 1, switch No. 1 is first operated to turn "ON" the combination UHF oscillator and helium lamp 7 for a duration of 100 milliseconds at a repetition rate of 1 cycle per second. The metastable helium cell 11 is turned on at full intensity when the lamp 7 is turned on, but two milliseconds later switch 2 interconnects infrared detector 12, a gate and storage circuit 13 to an amplifier 14 which supplies a bias that automatically optimizes the intensity of the metastable helium lamp 7. The problem to be dealt with with this feedback control loop is that the light intensity from metastable helium lamp 7 overshoots and does not attain its steady state value until about 400 milliseconds after it has been turned on with the result that the modulated light signal rides on a slope of the light pulse and is therefore difficult to amplify. Therefore, it was found necessary to regulate the light intensity by employing this feedback circuit during the application of the pulse from lamp 7. The signal detector 21 is active only from 16 milliseconds after the lamp 7 is turned on to 92 milliseconds of the "ON" cycle, this operation being accomplished by switch 17 and the gate and storage circuit 22. When the signal on the modulated light beam is detected at 21, and before this signal can be amplified, it must be separated from the large step voltage change that takes place when the lamp 7 is turned on and off. This voltage step is a thousand times larger than the signal to be amplified. Separation is accomplished by the use of a low leakage storage condenser and a low leakage diode gate, both of which comprise block 22 of FIG. 1. The gate and storage combination 22 opens after the lamp 7 is already on and closes before the lamp goes off and the condenser of the storage section of 22 holds a charge that exactly bucks out or cancels the large step voltage change.

The output signal from amplifier 23 is fed to the phase detector 25 only after 18 milliseconds have elapsed after the light is turned off to 91 milliseconds of the ON cycle, and this operation is accomplished by switch 18 and gate circuit 24. The FM oscillator 27 is locked-in only after 20 milliseconds have elapsed after the lamp is turned on to 90 milliseconds of the ON cycle. This operation is accomplished by switch 19 and the gate and storage circuit 26, which interconnects phase detector 25 to FM oscillator 27. Gate and storage circuit 26 includes an RC circuit that is used both as a storage circuit and as a low pass filter. The last output from the phase detector must be stored between pulses so that the voltage controlled FM oscillator will maintain the approximate frequency of the resonance line of cell 11. At the beginning of the next pulse, gate and storage circuit 26 will open and since the frequency of the FM oscillator 27 is in the vicinity of the resonance line, the output from the phase detector 25 will again lock-in the FM oscillator 27. The oscillator 27 frequency will, however, tend to shift between pulses even though its input voltage is held constant by the storage circuit 26, and this is due to the basic instability of the FM oscillator 27 which is about two parts in $10^5$. When the oscillator 27 is operated in a closed loop, this stability is improved by a factor equal to the open loop gain which is in the order of 100 or more. Thus the FM oscillator may have to be "pulled in" to its corrected value at the beginning of a pulse from a distance away of 100 times its allowable fluctuation. The speed with which the oscillator pulls in determines the minimum pulse width that can be used in the system and is a function of the step response of the closed loop system. A pulse width of 100 milliseconds will meet this requirement for the system of FIG. 1, and the frequency response of this system is limited by the frequency with which the resonance line of cell 11 is swept. Therefore, the Rc circuit of the gate and storage circuit 26 is also used as a low pass filter to keep the frequency response of the system below the limit imposed by the sweep frequency and thereby insures stability of the oscillator 27.

Where the magnetometer system employs a single magnetometer for making measurements of the background field, the information may be obtained from the counter stage 28 connected ahead of mixer 31.

A similar magnetometer 29 may be connected to mixer 31 to form a differential system whose dynamic range is greatly increased over the single pulsed magnetometer. For the differential system above, no prior knowledge of the background field is required, and the high sensitivity characteristic of the single magnetometer is retained by utilizing a long base line between magnetometers. A rate meter 32 is utilized to obtain the signal from mixer 31 and the dynamic range of the system is limited only when the field difference of both magnetometers is greater than 10 milligauss, and is independent of the magnitude of the background magnetic field.

The output of the voltage controlled FM oscillator 27 may, for example, be mixed with a fixed reference oscillator such as crystal oscillator 30 and the difference of frequency between the two oscillators may be counted and integrated by the rate meter 32, the rate meter having a d.c. voltage output and a capacity to count up to 30 KC. At the end of the 100 millisecond period, the lamp is turned off and the voltage at the output of the rate meter is stored until the next pulse comes 900 milliseconds later.

A gate and storage circuit 33 which is controlled by switch 20 is used to supply the output signal of the magnetometer system to a graphic recorder connected to the out terminal thereof. The gate and storage circuit 33 closes between pulses so that the unregulated noise of the FM oscillator 27 will not show up in the output. An RC circuit may be used in combination with gate and storage circuit 33 and positioned at the output thereof to serve as both the integrator for the rate meter as well as the storage circuit for block 33. The high input impedance of field effect transistors is used in the storage circuit of 33 to prevent leakage of the condenser charge, and the output is then filtered 44 and fed to the graphic recorder to permanently record the geomagnetic field at frequencies below one cycle per second.

All of the switches 15–20 and 34 of FIGS. 1 and 3 may be turned on in the aforedescribed sequence by, or for that matter, replaced by a group of Schmidtt trigger circuits. These circuits may be driven by the same triangular pulse 40 and the threshold level of the various trigger circuits adjusted to be energized in a desired timed sequence. Therefore the pulse width necessary to open the various gates may be adjusted by merely adjusting the threshold value of the trigger circuits of FIG. 3 and the timing of the gates may be arranged so that each gate opens slightly after and closes slightly before the preceding gate, thus reducing transients and allowing for recovery time of each gate.

The absorption cell 11 in which metastable helium atoms are created and optical pumping takes place is of the type disclosed in the patent application to H. W. Anderson, deceased, et al, entitled, "Glass Cells Containing Helium of High Purity", Ser. No. 254,027 now U.S. Pat. Ser. No. 3,178,864, assigned to the assignee of the present application.

The important properties for high sensitivity are a good signal-to-noise ratio and a narrow resonance line width, with the signal-to-noise ratio being a function of the helium atom's alignment and dependent upon the light intensity, the pressure and impurities of the metastable cell 11. Line width is dependent upon the relaxation time of the cell. Observed relaxation times of 20 milliseconds have been reported for metastable helium atoms in pulsed discharges. This indicates that considerably narrower lines are possible if perturbations due to the discharge can be avoided. The present magnetometer uses standard narrow-band techniques and it is possible to find the center of the resonance line to one part per hundred. Therefore, in making an absolute measurement of the background field, the error introduced is not greater than ±0.5 gamma and the signal-to-noise ratio of the magnetometer has been as high as 1000. The signals from detector 21, wherein lead sulphide was used as a photocell, have been recorded up to 80 millivolts, thus giving a possible sensitivity of 0.0025 gamma. Sensitivities of 0.2 gamma have been achieved with the pulse mode of operation, and better sensitivities may be achieved with the refinement of the system.

CONCLUSION

Obviously many modifications and variations of the present invention are possible in the light of the above teachings. It is therefore to be understood that within the scope of the appended claims, the invention may be practiced otherwise than specifically described.

What is claimed and desired to be secured by Letters Patent of the United States is:

1. A pulsed helium magnetometer comprising;
a cell containing metastable helium adapted to be placed in a magnetic field to be measured,
means including a helium lamp for optically pumping said metastable helium to produce atomic alignment of the helium atoms capable of undergoing magnetic resonance at a frequency dependent on said magnetic field,
means for pulsing said lamp to transmit high intensity light pulses to said cell,
detection means connected to receive light pulses radiated by said cell and to provide an output signal representative of variations in intensity of said radiated pulses,
variable frequency oscillator means for receiving said output signal means responsive to said oscillator means for establishing a continuously applied non-interrupted RF field to said helium atoms substantially at said magnetic resonance frequency,
phase detector means interconnecting said variable frequency oscillator means and said detection means for locking said variable frequency oscillator to said resonant frequency in response to said output signal,
means for coupling said RF field to said helium atoms in said cell,
and means for measuring the frequency of said variable frequency oscillator upon variation thereof in response to said output signal representative of variations in said radiated light pulses in accordance with changes in the background magnetic field incident upon said cell.

2. The combination of claim 1 which further includes an ultra-high frequency oscillator for exciting said lamp and
a first switch means for periodically energizing said ultra-high frequency oscillator for short durations.

3. The combination of claim 2 which further includes a biasing circuit for optimizing the intensity of said lamp and interconnecting the output of said cell and the input of said lamp,
said circuit including a detector for producing a bias voltage and
gate means receiving said bias voltage and,
means interconnecting said gate means and said ultra-high frequency oscillator for transmitting a bias voltage to said ultra-high frequency oscillator, said interconnecting means including storage means for maintaining the voltage at said gate means above a predetermined value between pulses from said ultra-high frequency oscillator.

4. The combination of claim 3 which further includes a second gate means interposed between said detection means and said phase detector means,
a third gate means interposed between said phase detector means and said variable frequency oscillator means,
a rate meter interconnecting a fourth gate means and said variable frequency oscillator, each of said gate means having a storage means connected thereto,
and switch means energizing, in succession, said first, second, third, and fourth gate means whereby each gate opens slightly after and closes slightly before the preceding gate.

5. The combination of claim 4, which further includes a second pulsed helium magnetometer, and
a mixer connected to receive the output from said second magnetometer and said variable frequency oscillator and having its output connected to said rate meter whereby said rate meter will record the differential magnetic field of said magnetometers.

6. A pulsed helium magnetometer system comprising;
a cell containing metastable helium,
an ultra-high frequency oscillator connected to drive a helium lamp for optically pumping said metastable helium to produce atomic alignment of the helium atoms,
means for periodically pulsing said ultra-high frequency oscillator for short durations to transmit high intensity light pulses to said cell,
detection means connected to receive light pulses radiated by said cell and to provide an output signal representative of variations of said radiated pulses,
variable frequency oscillator means connected to said detection means and adapted to be frequency controlled by variations in said radiated pulses,
a feedback circuit for transmitting the radio frequency field of said variable frequency oscillator to said cell at the resonant frequency of said cell,
a biasing circuit interconnecting said cell and said ultra-high frequency oscillator to provide a bias voltage to said ultra-high frequency oscillator in response to variations in said radiated light pulses, and
counter means connected to the output of said variable frequency oscillator to measure the frequency thereof as indicative of the strength of said background magnetic field in said cell.

7. The combination of claim 6 which further includes a mixer interconnecting a rate meter to said variable frequency oscillator, and
a second pulsed helium magnetometer connected to said mixer whereby said rate meter will record the differential background magnetic field of both magnetometers to increase the dynamic range of the system.

8. The combination of claim 7 which further includes;
a phase detector means interconnecting said variable frequency oscillator and said detection means for locking said variable frequency oscillator to said resonant frequency of said cell, said biasing circuit including a detector for producing a control signal, first gate means receiving said control signal for transmitting a bias voltage to said ultra-high frequency oscillator, said gate means including a storage circuit for maintaining the voltage at said gate means above a predetermined value, second gate means interposed between said detection means and said phase detector means, a third gate means interposed between said phase detector means and said variable frequency oscillator, and a fourth gate means connected to the output of said rate meter, and a switch means energizing in succession said first, second, third, and fourth gate means whereby each gate opens slightly after and closes slightly before the preceding gate.

9. The combination of claim 8 wherein a circular polarizer is interposed between said helium lamp and said cell.

* * * * *